(12) United States Patent
Suzuki et al.

(10) Patent No.: US 8,610,034 B2
(45) Date of Patent: Dec. 17, 2013

(54) HEATER, MANUFACTURING APPARATUS FOR SEMICONDUCTOR DEVICE, AND MANUFACTURING METHOD FOR SEMICONDUCTOR DEVICE

(75) Inventors: Kunihiko Suzuki, Shizuoka-ken (JP); Shinichi Mitani, Numazu (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 774 days.

(21) Appl. No.: 12/547,360

(22) Filed: Aug. 25, 2009

(65) Prior Publication Data

US 2010/0055925 A1 Mar. 4, 2010

(30) Foreign Application Priority Data

Aug. 26, 2008 (JP) ................................. 2008-216630
Mar. 19, 2009 (JP) ................................. 2009-068254

(51) Int. Cl.
*H01L 21/465* (2006.01)
*H05B 3/03* (2006.01)

(52) U.S. Cl.
USPC ................. 219/444.1; 118/725; 257/E21.485

(58) Field of Classification Search
USPC ........................................ 219/444.1; 118/725
See application file for complete search history.

(56) References Cited

U.S. PATENT DOCUMENTS

2007/0221649 A1* 9/2007 Ohta et al. ..................... 219/385
2008/0056692 A1* 3/2008 Yeh .............................. 392/407

FOREIGN PATENT DOCUMENTS

| JP | 10-208855 | 8/1998 |
| JP | 11-121385 | 4/1999 |
| JP | 2006-127883 | 5/2006 |

OTHER PUBLICATIONS

Notification of Reason(s) for Refusal issued by the Japanese Patent Office on May 8, 2012, for Japanese Patent Application No. 2009-068254, and English-language translation thereof.

\* cited by examiner

*Primary Examiner* — Alexander Ghyka
(74) *Attorney, Agent, or Firm* — Finnegan, Henderson, Farabow, Garrett & Dunner, L.L.P.

(57) ABSTRACT

A heater for heating a wafer includes elements that are arranged at a distance from one another in a rotationally symmetrical fashion with respect to a shaft extending through a center of the wafer, an electrode being provided to each of the elements to heat the wafer uniformly.

9 Claims, 4 Drawing Sheets

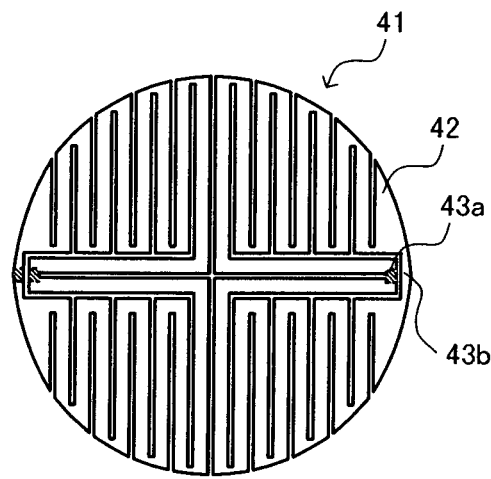
Fig.4
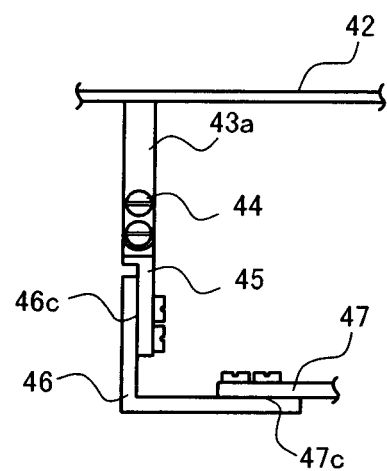 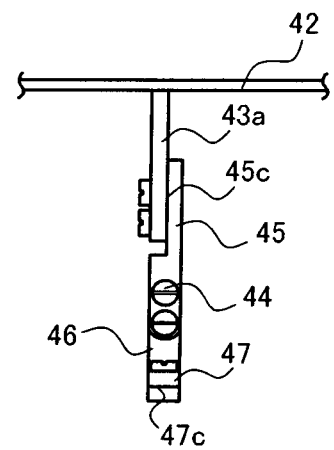
Fig.5A         Fig.5B

HEATER, MANUFACTURING APPARATUS FOR SEMICONDUCTOR DEVICE, AND MANUFACTURING METHOD FOR SEMICONDUCTOR DEVICE

CROSS-REFERENCE TO RELATED APPLICATIONS

This application is based upon and claims the benefit of priority from the prior Japanese Patent Applications No. 2008-216630 filed on Aug. 26, 2008, and No. 2009-068254 filed on Mar. 19, 2009, the entire contents of which are incorporated herein by reference.

BACKGROUND OF THE INVENTION

The present invention relates to a heater for heating a semiconductor wafer, for example, and to a manufacturing apparatus for semiconductor device and a manufacturing method for semiconductor device for forming a film by supplying a process gas while heating the semiconductor wafer, for example.

In a recent trend of price reductions and higher performance required in semiconductor devices, there is an increasing requirement for higher productivity in wafer film formation processes, and for higher quality such as enhanced uniformity in film thickness, for example.

To satisfy such a requirement, there has been used a single wafer epitaxial film forming apparatus, with heating a wafer from bottom face thereof with a heater and supplying a process gas while rotating the wafer at a high speed of 900 rpm or more, for example.

To obtain a uniform film thickness in this process, it is necessary to uniformly heat the wafer with a heater. As disclosed in Japanese Patent Application Laid-Open No. 10-208855 (particularly, in [0017], [0018], and FIG. 8), for example, an outside heater for heating the outer circumferential portion where a temperature is likely to drop, as well as an inside heater for heating the entire surface of a wafer, is provided.

To achieve even higher productivity, a large-diameter wafer of 300 mm in diameter, for example, is used recently. The heater for heating such a large-diameter wafer is also required to have a large diameter.

However, heater members made of SiC, for example, thermally expand. Stress is put on fixed portions due to thermal stress, which causes damage. Furthermore, when the heater elements become larger with larger diameters, the heater positioning accuracy becomes remarkably poorer, and uniform temperature control becomes difficult due to warpage or the like.

SUMMARY

According to an embodiment of the present invention, there is provided a heater for heating a wafer, the heater including a plurality of elements that are arranged at a distance from one another in a rotationally symmetrical fashion with respect to a shaft extending through a center of the wafer, an electrode being provided to each of the elements.

According to an embodiment of the present invention, there is provided a semiconductor manufacturing apparatus that includes: a reaction chamber into which a wafer is to be loaded; a gas supply mechanism that is placed at an upper portion of the reaction chamber and supplies a process gas; a gas discharge mechanism that discharges a gas from the reaction chamber; a susceptor that holds the wafer; a heater arranged at a distance from the wafer, the heater including a plurality of elements arranged at a distance from one another in a rotationally symmetrical fashion with respect to a shaft extending through the center of the wafer, an electrode being provided to each of the elements at a central portion thereof; and a rotational drive mechanism that rotates the wafer.

According to an embodiment of the present invention, there is provided a semiconductor manufacturing apparatus that includes: a reaction chamber into which a wafer is to be loaded; a gas supply mechanism that is placed at an upper portion of the reaction chamber and supplies a process gas; a gas discharge mechanism that discharges a gas from the reaction chamber; a susceptor that holds the wafer; a heater arranged at a distance from the wafer; an electrode that is integrally formed with the heater and supplies a current to the heater; a first wiring component that has a first connection face connected to the electrode; a second wiring component that has a second connection face connected to the first wiring component, the second connection face being perpendicular to the first connection face; a third wiring component that has a third connection face connected to the second wiring component, the third connection face being perpendicular to the first connection face and the second connection face; and a rotational drive mechanism that rotates the wafer.

According to an embodiment of the present invention, there is provided a semiconductor manufacturing method that includes: holding a wafer in a reaction chamber; supplying a process gas onto the surface of the wafer; adjusting the pressure in the reaction chamber to a predetermined value, by discharging a gas from the reaction chamber; rotating the wafer; and forming a film on the surface of the wafer by heating the wafer by causing a heater to generate heat through voltage application from an electrode provided at each center portion of elements forming the heater, the elements being arranged in a rotationally symmetrical fashion with respect to a shaft extending through the center of the wafer.

According to an embodiment of the present invention, there is provided a semiconductor manufacturing method that includes: holding a wafer in a reaction chamber; supplying a process gas onto the surface of the wafer; adjusting the pressure in the reaction chamber to a predetermined value, by discharging a gas from the reaction chamber; rotating the wafer; and forming a film on the surface of the wafer by heating the wafer by causing a heater to generate heat through voltage application via a third wiring component, a second wiring component, a first wiring component, and an electrode, a first connection face of the first wiring component being connected to the electrode integrally formed with the heater, the second wiring component being connected to the first wiring component on a second connection face perpendicular to the first connection face, the third wiring component being connected to the second wiring component on a third connection face perpendicular to the first connection face and the second connection face.

BRIEF DESCRIPTION OF THE DRAWINGS

FIG. 4 is a top view of a heater in accordance with an embodiment of the present invention;

FIG. 5A is a side view of the heater in accordance with an embodiment of the present invention;

FIG. 5B is another side view of the heater in accordance with an embodiment of the present invention;

DETAILED DESCRIPTION

Figure 1:
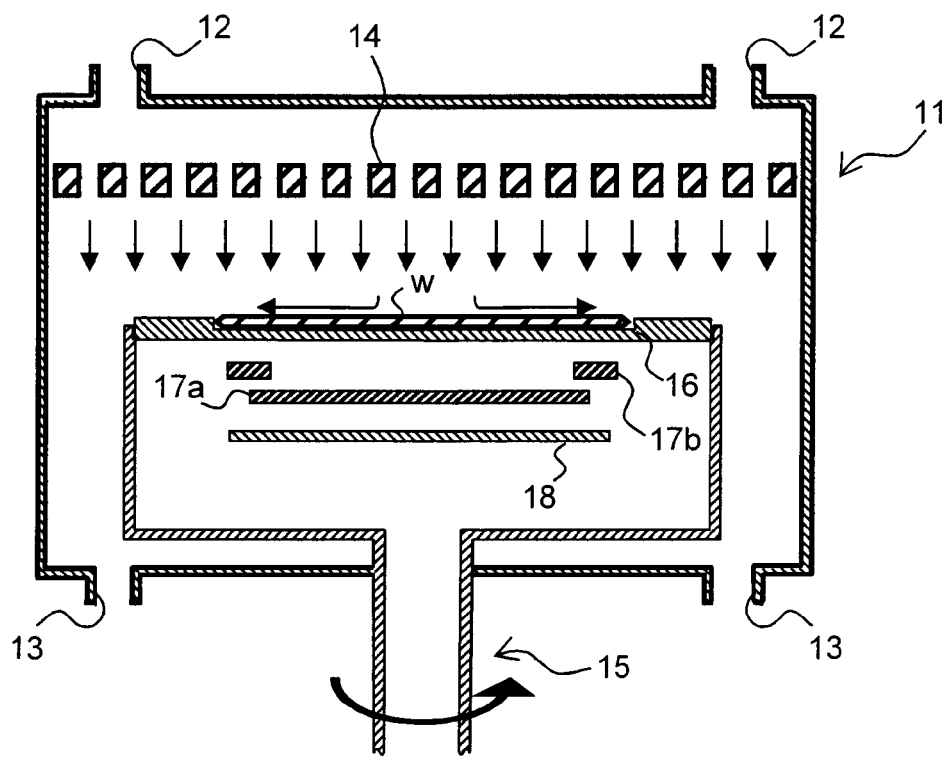
FIG. 1 is a cross-sectional view of a semiconductor device manufacturing apparatus in accordance with an embodiment of the present invention.

Reference will now be made in detail to the present embodiment of the invention, an example of which is illustrated in the accompanying drawings. Wherever possible, the same reference numbers will be used throughout the drawing to refer to the same or like parts.

Embodiments of the present invention will now be described with reference to the accompanying drawings.

First Embodiment

FIG. 1 is a cross-sectional view of a semiconductor device manufacturing apparatus in accordance with this embodiment. Gas supply inlets 12 connected to a gas supply mechanism (not shown) are provided to a reaction chamber 11 in which a wafer w is subjected to film formation processing. The gas supply mechanism is designed to supply a process gas containing a source gas such as TCS or dichlorosilane from upper portion of the reaction chamber 11. Gas discharge outlets 13 that are connected to a gas discharge mechanism (not shown) are provided at two positions in a lower portion of the reaction chamber 11. The gas discharge mechanism is designed to discharge gases and control the pressure in the reaction chamber 11 to be constant (atmospheric pressure).

Straightening vanes 14 for supplying the process gas that is supplied via the gas supply inlets 12 in a straightened state onto the wafer ware provided at an upper portion in the reaction chamber 11.

A rotational drive mechanism 15 for rotating the wafer w and a susceptor 16 as a wafer holding member for holding the wafer w are provided at lower portions of the reaction chamber 11. The rotational drive mechanism 15 includes a motor (not shown) and a rotary shaft (not shown), and the susceptor 16 is connected to the rotational drive mechanism 15. An inside heater 17a made of SiC, for example, and designed to heat the wafer w is provided below the susceptor 16. An outside heater 17b made of SiC, for example, and designed to heat the peripheral portion of the wafer w is provided between the susceptor 16 and the inside heater 17a. A disk-like reflector 18 for efficiently heating the wafer w is provided below the inside heater 17a.

Figure 2:
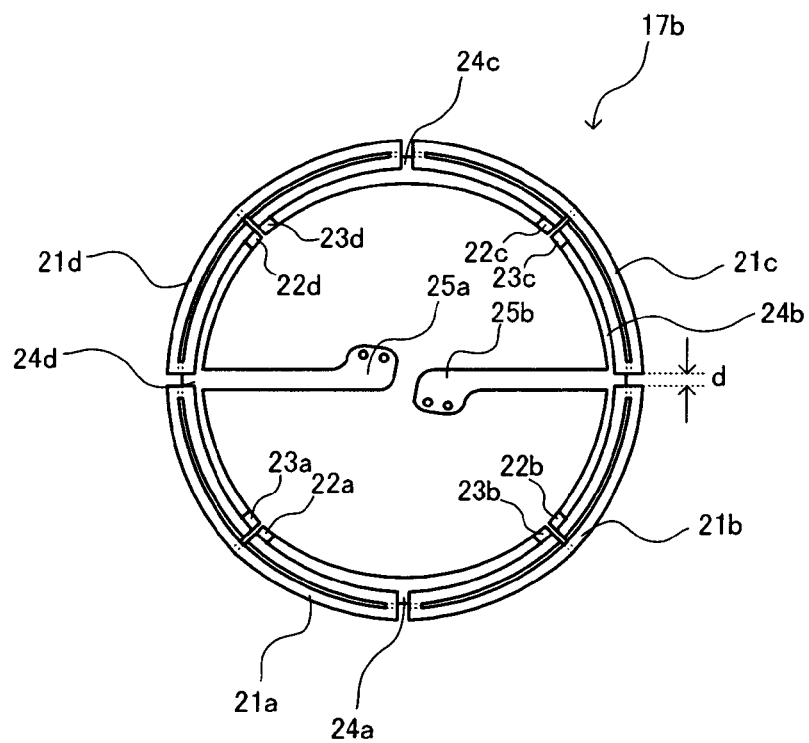
FIG. 2 is a top view of an outside heater in accordance with an embodiment of the present invention.
Figure 3:
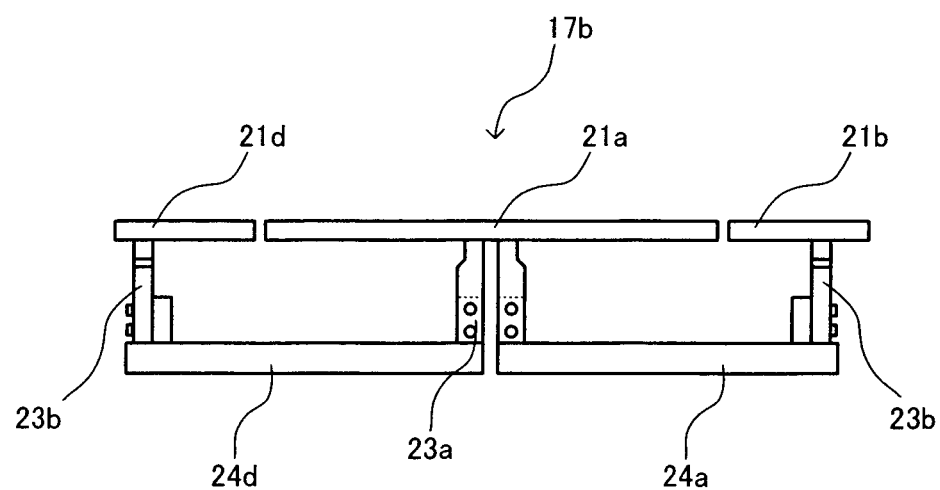
FIG. 3 is a side view of the outside heater in accordance with an embodiment of the present invention.

FIG. 2 is a top view of the outside heater, and FIG. 3 is a side view of the outside heater. The outside heater 17b is divided into four elements 21a, 21b, 21c, and 21d. Each of the elements 21a, 21b, 21c, and 21d has a structure in which an inner circumferential portion and an outer circumferential portion are connected at end portions thereof, and there is a gap at the center of the inner circumferential portion. At the center gap portions, the elements 21a, 21b, 21c, and 21d are connected to and held by electrodes 22a and 23a, electrodes 22b and 23b, electrodes 22c and 23c, and electrodes 22d and 23d, respectively. The distance d between each two adjacent elements of the elements 21a, 21b, 21c, and 21d is the same, and is approximately 6 mm, for example.

The electrode 22a is connected to the electrode 23b via a wiring component 24a, and the electrode 22b is connected to the electrode 23c via a wiring component 24b. Further, the electrode 22c is connected to the electrode 23d via a wiring component 24c, and the electrode 22d is connected to the electrode 23a via a wiring component 24d. The wiring component 24d has an external connection terminal 25a, and the wiring component 24b has an external connection terminal 25b. These external connection terminals are connected to external electrodes (not shown).

With the use of such a semiconductor device manufacturing apparatus, a Si epitaxial film is formed on the wafer w, for example. The wafer w of 300 mm in diameter is loaded into the reaction chamber 11, and is placed on the susceptor 16. The temperature of the inside heater 17a is adjusted to approximately 1400° C., and the temperature of the outside heater 17b is adjusted to approximately 1500° C., so that the temperature of the wafer 2 becomes 1100° C.

In this process, in the outside heater 17b having the greater outside diameter, a voltage is applied to each of the external connection terminals 25a and 25b connected to external electrodes (not shown), so as to heat each of the elements to 1500° C., for example. Through the heating, each of the elements thermally expands toward the end portions (in the circumferential direction), with each of the electrodes to which the elements are fixed being the center of expansion. The distance d between each two elements becomes approximately 2 mm, for example. However, short circuit or warpage is not caused in the elements, and the heating is performed stably and uniformly on the outer circumference of the wafer w.

The wafer w is rotated by the rotational drive mechanism 15 at 900 rpm, for example, and the process gas is supplied via the gas supply inlets 12 onto the wafer w in a straightened state through the straightening vanes 14. The process gas is prepared so that the TCS density is 2.5%, and is supplied at 50 SLM, for example.

The process gas containing excess TCS and a diluted gas, and a gas such as HCl as a reaction by-product are discharged through the gas discharge outlets 13, and the pressure in the reaction chamber 11 is controlled to be constant (atmospheric pressure, for example).

In this manner, a Si epitaxial film is grown on the wafer w. In this process, the thermal stress is suppressed, and accordingly, warpage in the outside heater is also suppressed. Since the distance between the outside heater and the wafer w is maintained constant, a uniform film thickness can be achieved. Furthermore, damage to the outside heater due to the thermal stress caused by the state fixed to the electrodes is suppressed. Accordingly, the maintenance frequency is lowered, and the decrease in productivity can also be suppressed.

To increase the diameter of the largest-diameter outside heater so as to treat the wafer having the diameter of 300 mm, it is necessary to process SiC or the like to have a diameter of 500 mm, for example. However, it is difficult to stably produce a component of such a large diameter (blank cutout), and an increase in production costs is considered inevitable. By dividing a heater into four elements as in this embodiment, a stable blank cutout can be realized using existing techniques.

Although the outside heater is divided into elements in this embodiment, this is not necessarily limited to the outside heater. For example, this may be applied to the inside heater. To treat a wafer of 300 mm in diameter, the diameter of the inside heater is approximately 300 mm. However, since the inside heater is also fixed by electrodes, the thermal stress can be suppressed by dividing the inside heater into elements. Accordingly, warpage and damage can be suppressed, and the maintenance frequency is lowered. Thus, a uniform film formation can be achieved, and the decrease in productivity can be suppressed.

When a mid heater is provided between the outside heater and the inside heater, the mid heater may also be divided into elements.

Although the heater is divided into four elements in this embodiment, the number of elements is not limited to four, as long as the elements are arranged in a rotationally symmetrical manner. To achieve a stable power supply and perform uniform heating, it is preferable to divide the heater into an even number of elements. To achieve stable heater production, it is preferable to divide the heater into three or more elements. To perform uniform heating, the distance between each two adjacent elements is the same.

Second Embodiment

This embodiment is the same as the first embodiment in the structure of the semiconductor device manufacturing apparatus, but differs from the first embodiment in that a booth bar serving as a wiring component for securing electrodes is divided into three, and the vertically-oriented faces of the booth bars are connected to one another.

Figure 6:
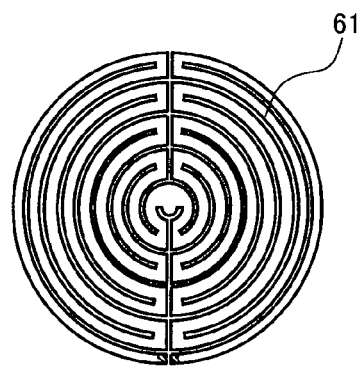
FIG. 6 shows a pattern of an element of a heater in accordance with an embodiment of the present invention.

FIG. 4 is a top view of a heater, and FIGS. 5A and 5B are side views of the heater. As shown in the drawings, the heater 41 includes a resistance-heating-type heater element 42 made of a SiC-based material, for example, and divided into two at its center, and electrode bars 43a and 43b that are a pair of electrodes for supplying current to the element 42. The element 42 and the electrode bars 43a and 43b are integrally formed by welding or the like. The pattern of the element 42 shown in FIG. 4 is merely an example, and may be any other pattern, as long as the pattern can realize uniform heating of a semiconductor substrate, and can cope with temperature fluctuations. Alternatively, a heater element that is not divided, like the pattern of the heater 61 shown in FIG. 6, for example, may be used. The same applies to the element patterns described below.

The electrode bars 43a and 43b are secured in face-to-face contact with a booth bar 45 at a connection face 45c by bolts 44. The bolts 44 are made of a SiC-based material or the like, and the booth bar 45 is a wiring component made of Mo, carbon, or the like. The booth bar 45 is secured in face-to-face contact with a booth bar 46 at a connection face 46c, and the booth bar 46 is secured in face-to-face contact with a booth bar 47 at a connection face 47c. In this case, the plane directions of the connection faces 45c, 46c, and 47c are vertical directions.

The booth bar 47 is fixed to an electrode rod (not shown) by a bolt at an external connection terminal. The electrode rod is held by a base disk (not shown), and is connected to a temperature control mechanism (not shown).

Figure 7:
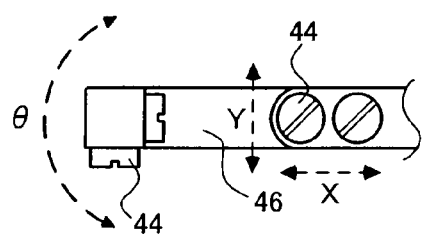
FIG. 7 shows a connection portion between booth bars in accordance with an embodiment of the present invention.

FIG. 7 shows the connection portion of the booth bar 46 and the booth bar 47. An opening having a larger diameter than the bolt diameter is formed in the booth bar 47 interposed between the bolt 44 and the booth bar 46. Accordingly, the connection position can be moved in the plane directions (the X and Y directions and the θ direction) within the range of the diameter difference.

The connection position between the electrode bar 43a and the booth bar 45, and the connection position between the booth bar 45 and the booth bar 46 can also be moved in the plane directions (the X and Y directions and the θ direction).

With the use of such a semiconductor device manufacturing apparatus, a Si epitaxial film, for example, is formed on the wafer w in the same manner as in the first embodiment.

In particular, to perform high-precision temperature control as required in formation of a thick film, the heater needs to be placed in a predetermined position with high attachment precision, so as not to cause unevenness in the temperature distributions when the wafer is rotated at a high speed. However, a manufacture error such as a welding error is caused on the heater side when the element of the heater is integrally formed with the electrode bars by welding. Also, if a stress is applied to the heater when the heater is attached in a predetermined position, warpage or cracks may be generated in the heater due to the thermal stress when there is a temperature rise.

In this embodiment, the connection positions are allowed to move in different three directions and its rotation direction. Accordingly, manufacture errors of a heater can be absorbed, and high precision attachment can be carried out, without a stress being applied to the heater. Since a constant distance between the heater and the wafer w can be maintained with high precision, a more uniform film thickness can be achieved. Accordingly, thermal stress is suppressed, and warpage, cracks, and damage in the heater can be suppressed. Thus, the maintenance frequency can be lowered, and the decrease in productivity can be suppressed.

Third Embodiment

This embodiment is the same as the first and second embodiments in the structure of the semiconductor device manufacturing apparatus, but differs from the second embodiment in that the heater is divided into a center portion and an outer circumferential portion, an intermediate portion is provided at a distance between the center portion and the outer circumferential portion, and each of these portions is divided into a plurality of elements as in the first embodiment.

Figure 8:
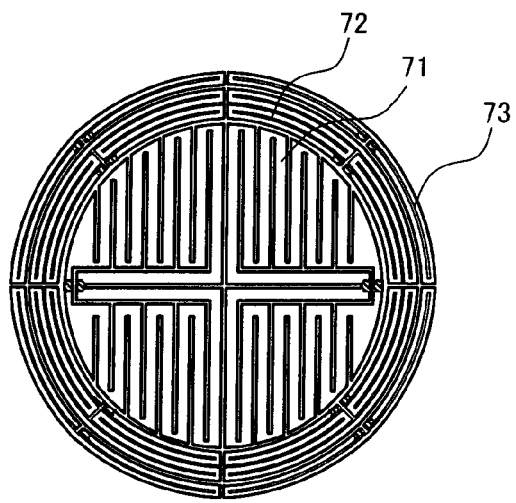
FIG. 8 illustrates a structure of elements in a heater in accordance with an embodiment of the present invention.

As shown in FIG. 8, an inside heater 71 is provided in the center portion, and an outside heater 72 is provided in the outer circumferential portion. A mid heater 73 is further provided at a predetermined distance between the inside heater 71 and the outside heater 72. Here, the distance needs to be set so that the heaters do not come into contact due to thermal expansion, which may cause short circuit therein, and that the temperature distribution is not affected due to long distances between the heaters.

With this arrangement, the heaters can be separated from one another, and each of the heaters can be placed with high attachment precision. Since the heaters are controlled independently of one another, the in-plane temperature of the wafer is controlled at a more uniform temperature with higher precision, and the film thickness uniformity can be improved. To perform high-precision temperature control, it is preferable that the mid heater 73 as the intermediate portion is provided. However, the arrangement may be of the inside heater 71 and the outside heater 72.

Furthermore, since each of the inside heater 71, the outside heater 72, and the mid heater 73 is divided into a plurality of elements, each heater can be stably formed even with a large diameter as in the first embodiment, and the thermal stress can be reduced. To reduce the thermal stress, it is preferable that each of the heaters is divided into elements. However, not all the heaters have to be divided, but it is sufficient if one of them is divided. In particular, if the outside heater having a large diameter is divided as in this embodiment, the advantageous effects can be achieved in the divided heater.

In the above embodiments, SiC is used for the elements of the heaters. It is preferable to use SiC, because SiC can be welded with electrodes, and has excellent processability and stability at high temperature. A sintered SiC may also be used, and may further be coated with high-purity SiC. The elements of the heaters may also be made of carbon bodies coated with high-purity SiC.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of a $SiO_2$ film and a $Si_3N_4$ film, and in the case of $SiO_2$ film, monosilane ($SiH_4$) and gases of $N_2$, $O_2$, and Ar are fed, and in the case of $Si_3N_4$ film, monosilane ($SiH_4$) and gases of $NH_3$, $N_2$, $O_2$, and Ar are fed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for manufacturing a semiconductor device, comprising:
    a reaction chamber configured to load a wafer in the reaction chamber;
    a gas supply mechanism placed at an upper portion of the reaction chamber and the gas supply mechanism configured to supply a process gas;
    a gas discharge mechanism configured to discharge a gas from the reaction chamber;
    a wafer holding member configured to hold the wafer;
    a heater arranged at a distance from the wafer, the heater including a plurality of elements arranged at a distance from one another in a rotationally symmetrical fashion with respect to a shaft extending through a center of the wafer, an electrode being provided to each of the elements at a central portion of the heater; and
    a rotational drive mechanism configured to rotate the wafer.

2. The apparatus according to claim 1, wherein the plurality of elements are arranged at uniform intervals.

3. The apparatus according to claim 1, wherein each of the plurality of elements is integrally formed with the electrode.

4. The apparatus according to claim 1, wherein the heater is an outside heater configured to heat an outer circumferential portion of the wafer, an inside heater configured to heat a center portion of the wafer, or a mid heater placed between the outside heater and the inside heater.

5. The apparatus according to claim 1, wherein the number of the plurality of elements is four.

6. The apparatus according to claim 1, further comprising:
    a first wiring component having a first connection face to be connected to the electrode;
    a second wiring component having a second connection face to be connected to the first wiring component, the second connection face being perpendicular to the first connection face; and
    a third wiring component having a third connection face to be connected to the second wiring component, the third connection face being perpendicular to the first connection face and the second connection face.

7. The apparatus according to claim 6, wherein the first connection face, the second connection face, and the third connection face have a movable connection position, respectively.

8. The apparatus according to claim 6, wherein the heater is an outside heater configured to heat an outer circumferential portion of the wafer, an inside heater configured to heat a center portion of the wafer, or a mid heater placed between the outside heater and the inside heater.

9. The apparatus according to claim 6, wherein each of the plurality of elements is integrally formed with the electrode.

* * * * *